(12) United States Patent
Wang et al.

(10) Patent No.: US 8,535,079 B2
(45) Date of Patent: Sep. 17, 2013

(54) BURN-IN SOCKET HAVING ACTUATING MECHANISM DRIVEN ALTERNATIVELY FOR DRIVING SLIDING PLATE

(75) Inventors: Quan Wang, Shenzhen (CN); Zhen-Qi Yang, Shenzhen (CN)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 245 days.

(21) Appl. No.: 13/080,677

(22) Filed: Apr. 6, 2011

(65) Prior Publication Data

US 2011/0250777 A1 Oct. 13, 2011

(51) Int. Cl.
*H01R 4/50* (2006.01)
(52) U.S. Cl.
USPC .......................................... 439/342; 439/331
(58) Field of Classification Search
USPC .................... 439/342, 331, 73, 330
See application file for complete search history.

(56) References Cited

U.S. PATENT DOCUMENTS

| | | | |
|---|---|---|---|
| 4,721,477 A * | 1/1988 | Lotter | 439/264 |
| 5,037,321 A | 8/1991 | Uratsuji et al. | |
| 5,186,642 A * | 2/1993 | Matsuoka et al. | 439/268 |
| 5,364,286 A * | 11/1994 | Matsuoka | 439/330 |
| 6,027,355 A * | 2/2000 | Ikeya | 439/268 |
| 6,383,002 B1 * | 5/2002 | Ohashi | 439/259 |
| 6,948,961 B2 * | 9/2005 | Oguchi | 439/160 |
| 7,878,837 B2 | 2/2011 | Hsieh et al. | |

* cited by examiner

*Primary Examiner* — Xuong Chung Trans
(74) *Attorney, Agent, or Firm* — Wei Te Chung; Ming Chieh Chang

(57) ABSTRACT

A socket connector includes a socket body, a sliding plate movably mounted upon the socket body, a plurality contacts received in the socket body and the sliding plate, and an actuating mechanism. The actuating mechanism includes a lid moving upwardly and downwardly between a first position away from the socket body and a second position close to the socket body, and a lever having one mating bar with at least a first tab and a second tab to be pressed by the lid so as to push the sliding plate moving.

16 Claims, 5 Drawing Sheets

BURN-IN SOCKET HAVING ACTUATING MECHANISM DRIVEN ALTERNATIVELY FOR DRIVING SLIDING PLATE

BACKGROUND OF THE INVENTION

1. Field of the Invention

The present invention relates to a burn-in socket, and more particularly to a burn-in socket having an actuating mechanism with a lever having two tabs which are pressed by a lid thereof in sequence so as to drive a sliding plate to move horizontally.

2. Description of Related Art

U.S. Pat. No. 7,878,837 issued to Hsieh et al. on Feb. 1, 2011 discloses a socket connector includes a socket body, a plurality of contacts, a moving plate movably mounted upon the socket body, and an actuating mechanism. The actuating mechanism comprises a lid, a first operating lever, and a second operating lever. The first and second operating levers are disposed between the lid and moving plate with opposite tilted angles. The second operating lever has a working end depressed by the lid so as to drive the moving plate to move in a substantially horizontal direction.

However, as the number of the contacts of the socket connector is increased while the height of the socket is unchanged, the configuration of the second operating lever will drive the moving plate to move a shorter distance than the predetermined distance along the horizontal direction. If the moving plate moves a shorter distance, the contacts will not establish a reliable interconnection with balls of an integrated circuit (IC) package.

Therefore, an improved socket connector is desired.

SUMMARY OF THE INVENTION

An object of the present invention is to provide a burn-in socket having an actuating mechanism with a lever having two tabs which are pressed by a lid thereof in sequence so as to drive a sliding plate to move horizontally.

According to one aspect of the present invention, there is provided a socket connector which includes a socket body, a sliding plate movably mounted upon the socket body, a plurality contacts received in the socket body and the sliding plate, and an actuating mechanism. The actuating mechanism comprises a lid moving upwardly and downwardly between a first position away from the socket body and a second position close to the socket body, and a lever having a first tab and a second tab which are pressed by the lid in sequence so as to urge the sliding plate to move during rotation of the lever.

According to another aspect of the present invention, there is provided with a socket connector comprises a socket body, a sliding plate, a plurality contacts, a lid, and a lever. The sliding plate is movably mounted upon the socket body. The contacts are received in the socket body and the sliding plate. The lid has a first position away from the socket body and a second position close to the socket body. A lever has a first end engaged with and pressed by the lid and a second end associated with the sliding plate such that when the lever is actuated by the lid and moved downwardly, the lever rotates and the second end thereof drives the sliding plate to move horizontally. The first end of the lever is formed with a first tab and a second tab respectively defining a first contacting portion and a second contacting point, the first contacting point being disposed at a higher level than the second contacting point and engages with the lid when the lid is located in an upper position and wherein after a proper rotation volume of the lever, the second contacting point comes to engage the lid instead of the first contacting point such that a further horizontal movement of the sliding plate is obtained.

Other objects, advantages and novel features of the invention will become more apparent from the following detailed description of a preferred embodiment when taken in conjunction with the accompanying drawings.

DETAILED DESCRIPTION OF THE INVENTION

Figure 1:
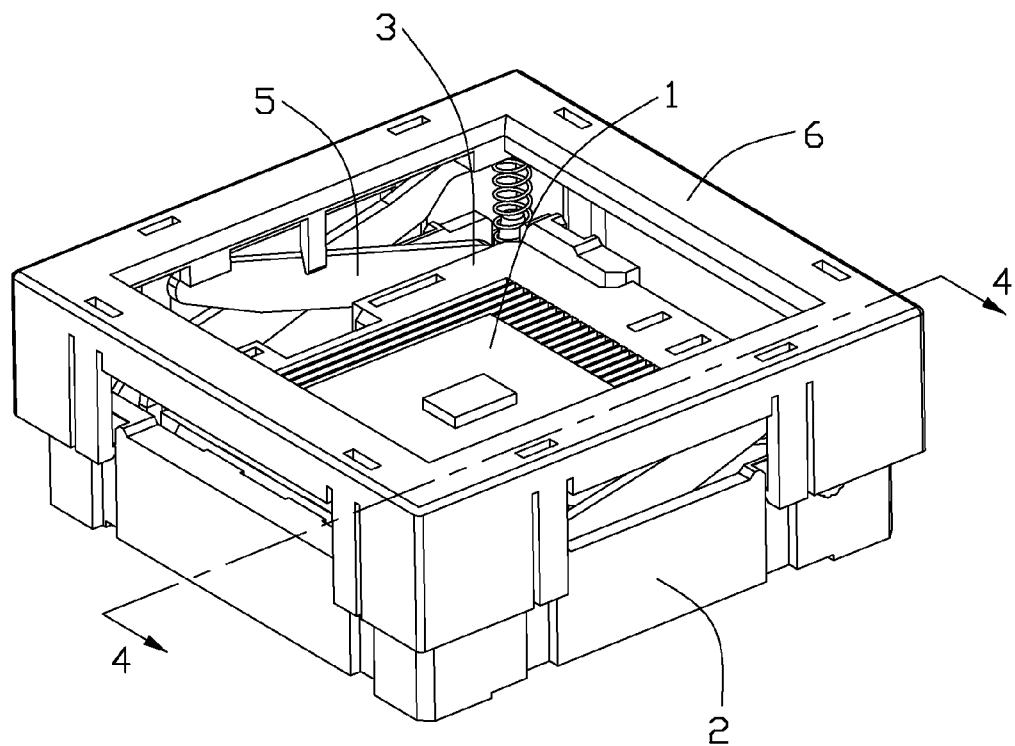
FIG. 1 is an assembled, perspective view of the present burn-in socket.
Figure 2:
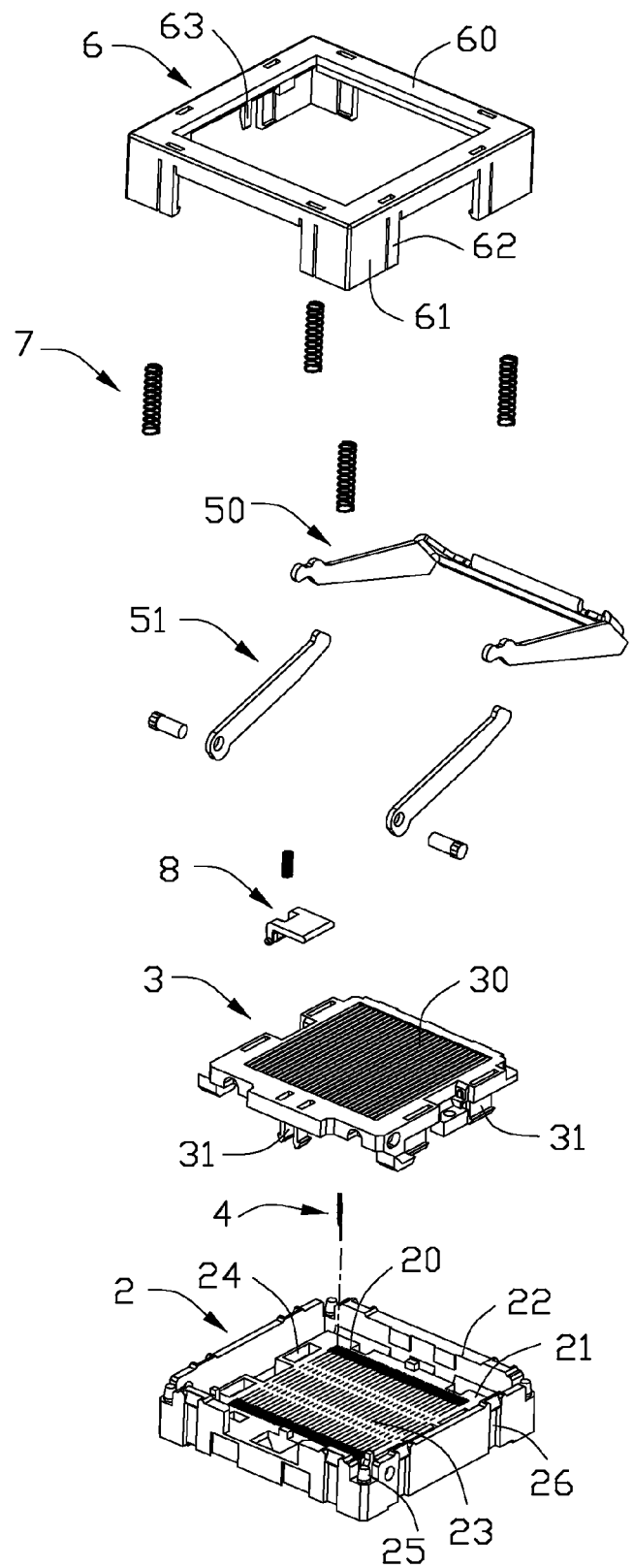
FIG. 2 is an exploded, perspective view of the burn-in socket showing in FIG. 1.

Referring to FIG. 1 and FIG. 2, a burn-in socket made in accordance with the present invention is provided for testing an IC package 1. The socket includes a socket body 2, a sliding plate 3 movably mounted within the socket body 2, a plurality of contacts 4 (only one contact was shown in FIG. 2) received in the socket body 2 and the sliding plate 3, and an actuating mechanism. The actuating mechanism includes a lid 6 mounted upon the socket body 2 and levers 5 mounted between the lid 6 and the sliding plate 3.

Referring to FIG. 2, the socket body 2 includes a base 21 with a plurality of passageways 20 and four sidewalls 22 surrounding the base 21. The base 21 and the sidewalls 22 jointly define a cavity 23 to receiving the sliding plate 3 and the levers 5. A plurality of holes 24 are defined on edges of the cavity 23 to match the sliding plate 3. The base 21 has four posts 25 located at corners to mate with springs 7 for providing elastic force to the lid 6. A plurality of slots 26 are defined on outer sides of the sidewalls 22.

A plurality of contacts 4 is assembled to the passageways 20 of the socket body 2 and inserted into the sliding plate 3. Regarding the working principle of the contact terminals, it can be readily recognized by referring to prior art U.S. Pat. No. 5,037,321 issued to Kazumi et al., typically, such as described in Column 4, paragraph 2 and FIGS. 6-8, which is herein incorporated as reference, and no detailed description is given.

Figure 3:
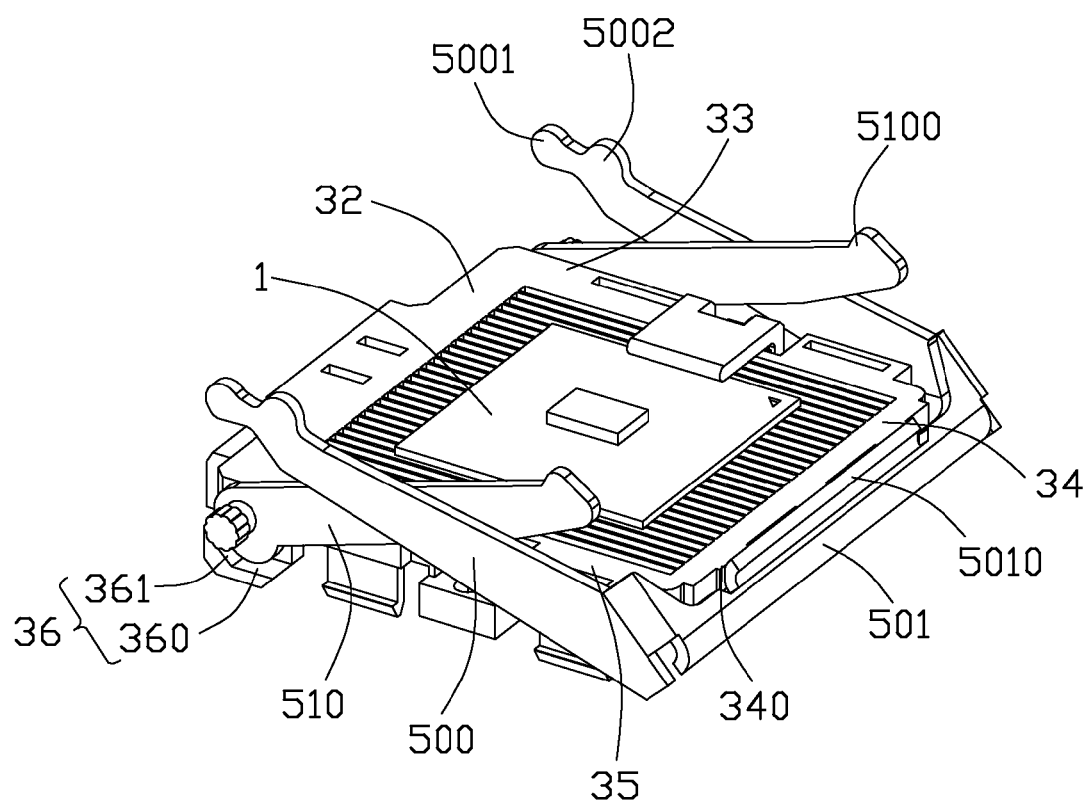
FIG. 3 is a perspective view of the burn-in socket with a pair of levers assembled onto a sliding plate.

FIG. 2 and FIG. 3 show a substantially rectangular sliding plate 3 provided a plurality of through holes 30 corresponding to the passageways 20. The contacts 4 are received in the passageways 20 and the through holes 30. A plurality of hooks 31 extend downwardly to be retained in the holes 24 of the socket body 2 and moveable in the holes 24. The sliding plate 3 comprises four edges, of which a first and a third edges 32, 34 are opposite to each other and a second and a fourth edges 33, 35 are opposite to each other. The second and the fourth edges 33, 35 respectively have a latch 8 (only one latch was shown in all figures) which can be opened and closed relative to the sliding plate 3, and a bearing section 36 which includes a planar surface 360 and an inclined surface 361 extending from the planar surface 360. A plurality of blocks 340 are positioned on the third edge 34.

The levers 5 includes a first lever 50 and a pair of second levers 51. The first lever 50 comprises a pair of parallel mating bars 500 and a pushing bar 501 connected with the mating bars 500. The pushing bar 501 is located at the third edge 34 of the sliding plate 3 and has an arc-shaped pushing section 5010 extending upwardly and engaging with the blocks 340 to push the sliding plate 3 to move horizontally. The mating bars 500 are disposed with angles with respect to the sliding plate 3 and each includes a first tab 5001 and a second tab 5002 extending upwardly at end thereof. The first tab 5001 is neighboring with the second tab 5002. The first and the second tabs 5001, 5002 have dome-shaped configurations in the present embodiment, and the diameter of the first tab 5001 is smaller than that of the second tab 5002. The second levers 51 are configured with identical arms 510 and are also inclined to the sliding plate 3. One end of each second lever 51 is located in the bearing sections 36 and the other end of the each second lever 51 has a contacting portion 5100.

The lid 6 has main body 60 configured with a frame structure. The main body 60 has four orientation portions 61 extending downwardly at the corners thereof A plurality of catchers 62 adjacent to the orientation portions 61 extend downwardly from the main body 60 to engage with the slots 26 of the body socket 2. Two pressing arms 63 extend downwardly from the main body 60 for opening the latches 8.

Figure 4:
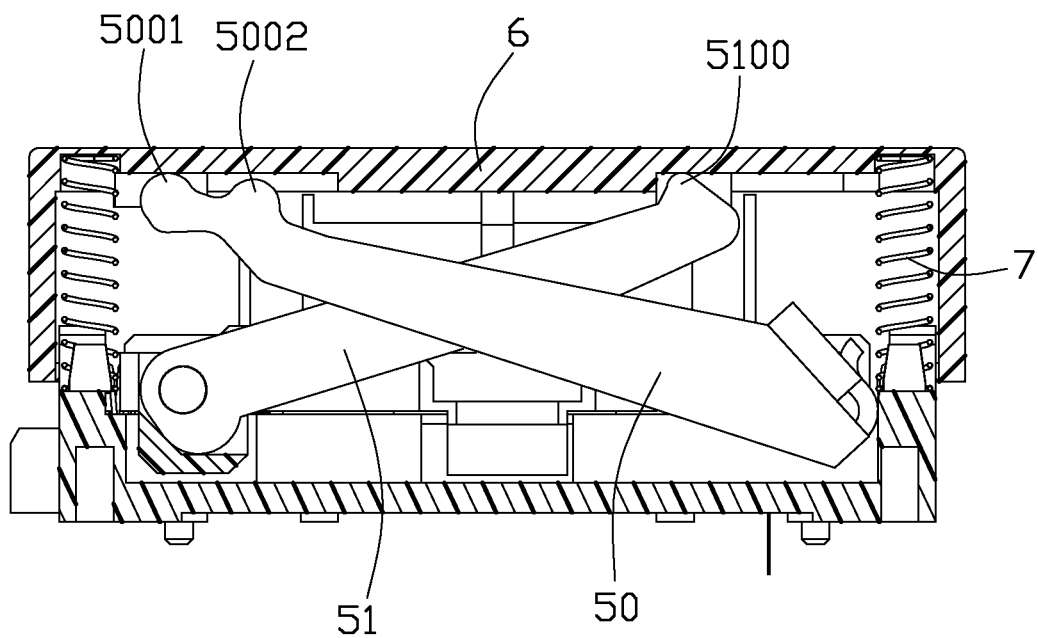
FIG. 4 is a sectional view of the burn-in socket taken from the line 4-4 of FIG. 1, showing a lid disposed in a first position.
Figure 5:
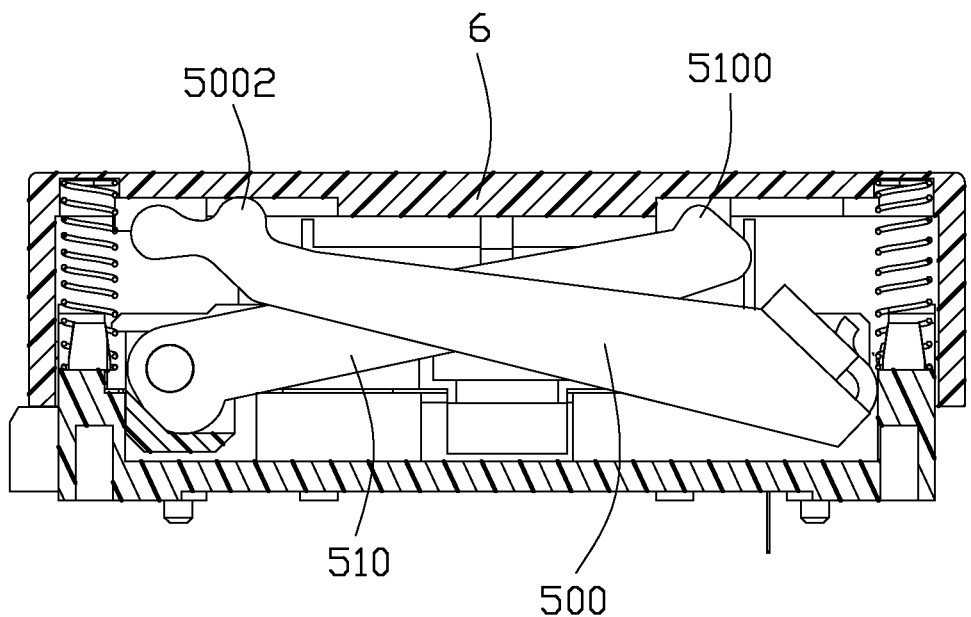
FIG. 5 is an another sectional view showing the lid disposed in a second position.

FIGS. 4 and 5 show a cross sectional view of the lid 6 located at a first position and a second position. When the lid 6 located at the first position in which the lid 6 is released and moves away from the socket body 2, the first tabs 5001 of the first levers 50 and the contacting portions 5100 of the second lever 51 both contact with a bottom of the lid 6, while the second tabs 5002 are out of engagement with the lid 6. The lid 6 will be moved downwardly as an external force exerted thereon. In that process, the first and the second levers 50, 51 are firstly moved downwardly toward the socket body 2. When the first lever 50 is rotated at a position that the top portions of the first tabs 5001 and the second tabs 5002 have a same distance with the bottom of the lid 6, respectively, the second tabs 5002 begin to engage with the lid 6 and first tabs begin to disengage with the lid 6. At the same time, the sliding plate 3 is moved horizontally relative to the body socket 2 as being pushed by the first and the second levers 50, 51. The lid 6 reached the second position when it can not be pressed any more. At the second position, the second tabs 5002 abut the lid 6 and the first tabs 5001 are disengaged with the lid 6, and the latches 8 are opened so as to receive the IC package 1 for testing.

In the present invention, even the number of the contacts 4 is increased and the height of the socket is not changed, the sliding plate 3 can also horizontally move a predetermined distance relative to the socket body 2, since the first and the second tabs 5001, 5002 can be pressed by the lid 6 in sequence and the levers 50, 51 will not be pressed when the lid 6 at the first position.

Although the present invention has been described with reference to particular embodiments, it is not to be construed as being limited thereto. Various alterations and modifications can be made to the embodiments without in any way departing from the scope or spirit of the present invention as defined in the appended claims.

What is claimed is:

1. A socket connector comprising:
   a socket body;
   a sliding plate movably mounted upon the socket body;
   a plurality contacts received in the socket body and the sliding plate; and
   an actuating mechanism comprising a lid moving upwardly and downwardly between a first position away from the socket body and a second position close to the socket body, and a lever having a first and second adjacent tabs which are pressed by the lid in sequence so as to urge the sliding plate to move during rotation of the lever, and wherein
   the lever comprises a pair of mating bars having two opposite ends, one end is as a fixed fulcrum and the other end defines the first tab and second tab, the first tab and the second tab has a half ball shapes respectively with a arc slot formed therebetween, and wherein
   a plurality of springs are disposed between the lid and the socket body to provide an elastic force for the lever rotating.

2. The socket connector as claimed in claim 1, wherein when the lid is located at the first position, the first tab engages with the lid and the second tab is out of engagement with the lid.

3. The socket connector as claimed in claim 1, wherein when the lid is located at the second position, the first tab is out of engagement with the lid and the second tab engages with the lid.

4. The socket connector as claimed in claim 1, wherein the lever comprises a pushing bar connected with the mating bars, and wherein the first and the second tabs are adjacent to each other and disposed on a same mating bar.

5. The socket connector as claimed in claim 4, wherein the pushing bar has an arc pushing section extending upwardly, and the sliding plate has a plurality of blocks to be pushed by the arc pushing section when the lid is moved from the first position to the second position.

6. The socket connector as claimed in claim 1, wherein lever is positioned between the lid and the sliding plate and angularly disposed relative to the sliding plate.

7. The socket connector as claimed in claim 1, further including another lever which includes a pair of parallel same arms with contacting portions at top free ends.

8. The socket connector as claimed in claim 7, wherein the lever and the another lever are both inclined to the sliding plate.

9. The socket connector as claimed in claim 7, wherein the sliding plate includes a pair of bearing sections at opposite edges thereof for receiving the another lever.

10. The socket connector as claimed in claim 9, wherein each bearing section includes a planar surface and an inclined surface extending upwardly from the planar surface.

11. A socket connector comprising:
    a socket body;
    a sliding plate movably mounted upon the socket body;
    a plurality contacts received in the socket body and the sliding plate;
    a lid movable between a first position away from the socket body and a second position close to the socket body; and
    a lever having a first end engaged with and pressed by the lid and a second end associated with the sliding plate such that when the lever is actuated by the lid and moved downwardly, the lever rotates and the second end thereof drives the sliding plate to move horizontally; wherein
    the first end of the lever is formed with a first tab and a second tab respectively defining a first contacting portion and a second contacting point, the first contacting point being disposed at a higher level than the second contacting point and engages with the lid when the lid is located in an upper position; and
    wherein after a proper rotation volume of the lever, the second contacting point comes to engage the lid instead of the first contacting point such that a further horizontal movement of the sliding plate is obtained; and wherein
    the lever comprises a pair of mating bars having two opposite ends, one end is as a fixed fulcrum and the other end defines the first tab and second tab, the first tab and the second tab has a half ball shapes respectively with an arc slot formed therebetween, and wherein a plurality of springs are disposed between the lid and the socket body to provide an elastic force for the lever rotating.

12. The socket connector as claimed in claim 11, wherein during the lid moves downwardly form the first position to the second position, the first tab is pressed firstly and the second tab is pressed after.

13. The socket connector as claimed in claim 11, wherein the lever comprises a pushing bar connected with the mating bars and wherein the first and the second tabs are disposed on a same mating bar.

14. A socket connector comprising:
a socket body;
a slide plate mounted upon the socket body and moveable relative to the socket body in a horizontal direction;
a plurality of contacts disposed in the housing with contacting sections in the slide plate;
an actuating mechanism associated with the socket body and the slide plate, and including a lid moveable relative to the socket body between opposite upper and lower positions via a spring, a lever actuated by the lid in a rotational manner about a bottom end; wherein spaced different first and second point engagements occur between the lid and a top end of the lever during downward movement of the lid and the lever so as to efficiently perform a movement of the slide plate in the horizontal direction, corresponding to a limited up and down movement of the lid; wherein when the lid is moved downwardly from an upper position to a lower position to compress the spring, the first point engagement occurs firstly and the second point engagement occurs successively; wherein said first point engagement is farther from the bottom end of the lever than the second point engagement therefrom; wherein said two spaced different point engagements are derived from two spaced tabs on either an under side of the lid or an upper side of the top end of the lever.

15. The socket connector as claimed in claim 14, wherein said two spaced tabs are formed on the lever.

16. The socket connector as claimed in claim 14, wherein the second tab is larger than the first tab.

* * * * *